United States Patent [19]

Goodman

[11] Patent Number: 4,507,334
[45] Date of Patent: Mar. 26, 1985

[54] SURFACE PREPARATION FOR DETERMINING DIFFUSION LENGTH BY THE SURFACE PHOTOVOLTAGE METHOD

[75] Inventor: Alvin M. Goodman, Princeton Township, Mercer County, N.J.

[73] Assignee: RCA Corporation, New York, N.Y.

[21] Appl. No.: 547,012

[22] Filed: Oct. 31, 1983

[51] Int. Cl.$^3$ ............................................. H01L 21/66
[52] U.S. Cl. ......................................... 427/93; 29/574; 156/662
[58] Field of Search ............................ 427/93; 29/574; 156/662

[56] References Cited

U.S. PATENT DOCUMENTS 4,333,051 6/1982 Goodman ..................... 324/158 R

OTHER PUBLICATIONS

A. M. Goodman, "Improvements In Method And Apparatus For Determining Minority Carrier Diffusion Length," International Electron Devices Meeting, Dec. 1980, pp. 231-234.
The American Society For Testing And Materials, "Minority Carrier Diffusion Length In Silicon By Measurement Of Steady-State Surface Photovoltage," ANSI/ASTM Standard F 391-78, pp. 770-776.
A. R. Moore et al., "Surface Treatment Of Silicon For Low Recombination Velocity," RCA Review, 17 3 (1956), pp. 5-12.
W. Kern et al., "Cleaning Solutions Based On Hydrogen Peroxide For Use In Silicon Semiconductor Technology," RCA Review, 31, 7 (1970), pp. 187-206.
A. M. Goodman, "Silicon-Wafer-Surface Damage Revealed By Surface Photovoltage Measurements," J. Appl. Phys. 53 (11), Nov. 1982, pp. 7561-7565.
A. M. Goodman et al., "Silicon-Wafer Process Evaluation Using Minority-Carrier Diffusion-Length Measurement By The SPV Method," RCA Review, 44 6 (1983), pp. 326-341.
D. G. Schimmel et al., "An Examination Of The Chemical Staining Of Silicon," J. Electrochem. Soc., vol. 125, Jan. 1978, pp. 152-155.
T. M. Buck et al., "Effects Of Certain Chemical Treatments And Ambient Atmospheres On Surface Properties Of Silicon," J. Electrochem. Soc., vol. 105, Dec. 1958, pp. 709-714.

Primary Examiner—John D. Smith
Attorney, Agent, or Firm—Birgit E. Morris; Donald S. Cohen; Joseph D. Lazar

[57] ABSTRACT

A method of treating the surface of a sample of n-type silicon material in preparation for measurements for determining the minority carrier diffusion length of the material by the surface photovoltage method comprises applying a strong oxidizing agent to an appropriately prepared surface of a semiconductor material such as silicon. The oxidizing agent is taken from the group consisting of potassium permanganate [$KMnO_4$], potassium dichromate [$K_2Cr_2O_7$], and ammonium dichromate [$(NH_4)_2Cr_2O_7$]. The surface preparation assures a consistently large surface photovoltage that is stable during the surface photovoltage measurement for minority carrier diffusion length.

4 Claims, 1 Drawing Figure

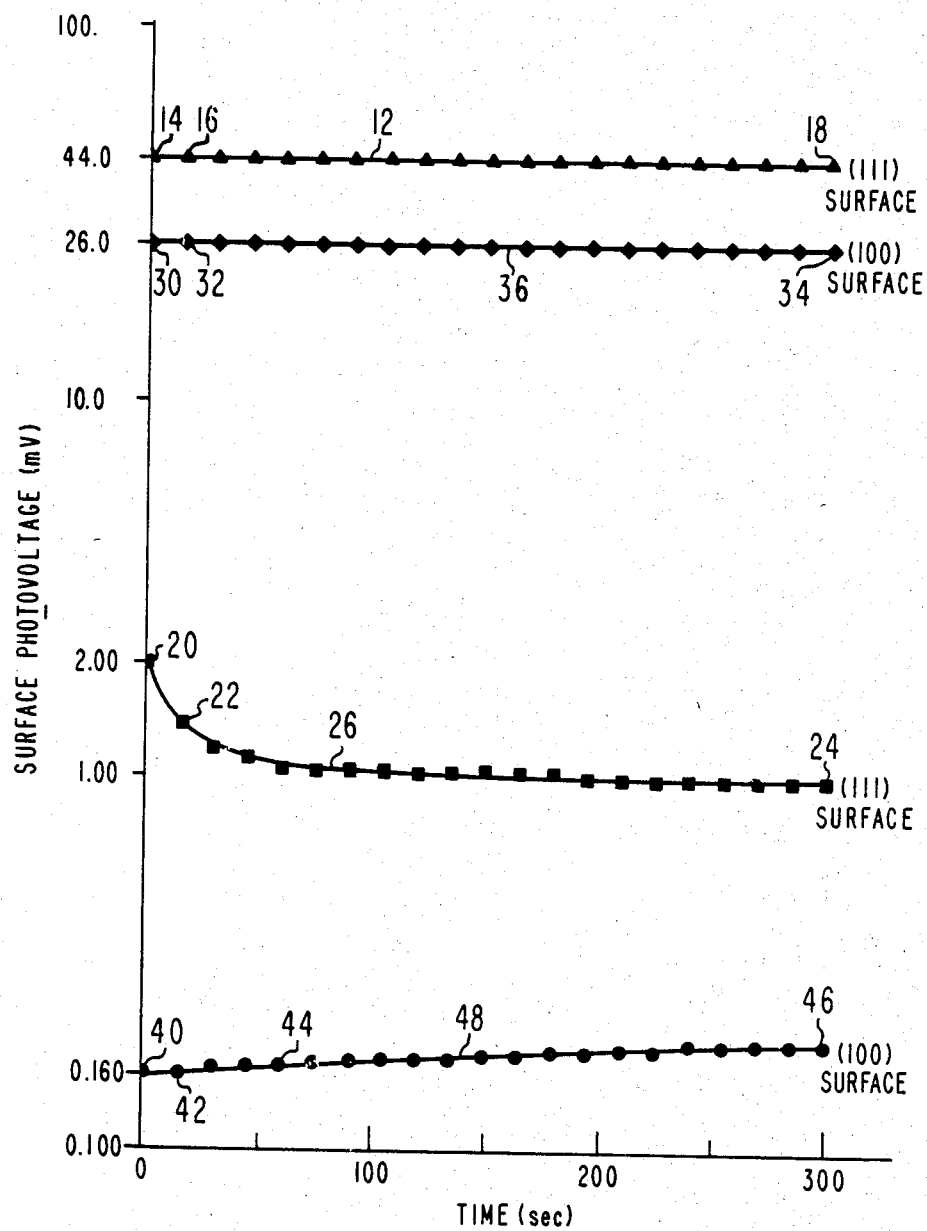

SURFACE PREPARATION FOR DETERMINING DIFFUSION LENGTH BY THE SURFACE PHOTOVOLTAGE METHOD

This invention relates to a surface preparation method for determining the minority carrier diffusion length in semiconductors using the constant-magnitude surface photovoltage method.

BACKGROUND OF THE INVENTION

Apparatus and methods for determining the minority carrier diffusion length (L) using the surface photovoltage method are well known. In brief, the principle of the diffusion length (L) determination requires the illumination of a specimen surface with monochromatic radiation of energy slightly greater than the bandgap of the semiconductor. Electron-hole pairs are produced and diffuse to the illuminated (front) surface where they are separated by the electric field of the depletion region (i.e., the surface-space-charge region) to produce a surface photovoltage. A portion of the surface photovoltage signal is coupled to an amplifier for amplification and measurement. The photon flux (photons per sq. cm. per second) is adjusted to produce the same magnitude of surface photovoltage at various wavelengths of illumination. The photon flux required to produce this constant magnitude surface photovoltage signal is conveniently plotted on the ordinate against the reciprocal of the absorption coefficient on the abscissa for each wavelength. The resultant plot is typically linear and is extrapolated to the zero photon flux intercept on the negative abscissa. This intercept value is the effective diffusion length (L). For a more detailed description of the theory and background for this method, see an article "A Method for the Measurement of Short Minority Carrier Diffusion Lengths in Semiconductors," by A. M. Goodman in the *Journal of Applied Physics*, Vol. 32, No. 23, pp. 2550–2552, December 1961 and the article by A. M. Goodman entitled "Improvements In Method and Apparatus For Determining Minority Carrier Diffusion Length", International Electron Devices Meeting, December 1980, pp 231–234. The American Society for Testing and Materials has adopted a standard using this method which is published as ASTM F 391-78. The ASTM standard, when implemented according to the block diagram of FIG. 1 of ASTM F 391-78, is provided particularly for testing the diffusion length (L) for minority carriers in silicon but the method in general may be used for other semiconductor materials.

See U.S. Pat. No. 4,333,051, incorporated herein by reference thereto, entitled "METHOD AND APPARATUS FOR DETERMINING MINORITY CARRIER DIFFUSION LENGTH IN SEMICONDUCTORS", issued on June 1, 1982 to A. M. Goodman for a description of an apparatus using this principle in which a servo system maintains a constant predetermined value of the surface photovoltage thereby allowing the measurements to be carrier out in a relatively short time. The surface photovoltage pickup electrode described in this patent minimizes the effects of drift caused by laterally diffusing minority carriers during a test.

In using the method F 391-78 of the American Society for Testing Materials, it is important to treat the surface of the material being tested in a way that provides for consistently large and stable surface photovoltage. The standard F 391-78 provides for certain conditions prior to the surface photovoltage testing including cleansing the surface and etching the surface if necessary. It has been determined by many uses of this method that the surface treatment recommended by the Standard F 391-78 for n-type Si wafers has been found to be unreliable. Moreover the results obtained from the use of the ASTM method depend strongly upon the sample's previous history. For example, as a silicon wafer is withdrawn from a hydrofluoride (HF) etching solution into the air, a stain film may be formed on the silicon surface. The stain film has a deleterious effect on the surface photovoltage signal in that is is either too low or unstable, or both. As shown in the art such a stain film can be avoided by quenching the HF-containing etch with distilled water before withdrawing the wafer into the air. Other techniques are known for obviating the effect of the stain film.

Nevertheless, even with great care in avoiding the stain film, the preparation of the surface of the material according to the technique suggested in the standard F 391-78, note 4, of boiling the material for n-type silicon, resulted in the surface photovoltage being still erratic and too small. Moreover, even when the surface photovoltages were large enough, the surface photovoltage tended to change with time. Such a condition hereinafter referred to as instability can cause a significant error in the measurement result. In one example, a 3% change in the photon flux ($I_o$) being used to maintain the surface photovoltage to a constant value during a 3-minute time period of measurement resulted in an inaccuracy of approximately 10% in the diffusion length determined. Errors in diffusion length (L) due to this instability are undesirable and errors larger than about 10% are to be avoided.

Accordingly, there is a need in the art for a surface preparation method to provide surface photovoltages that are both sufficient and stable for determining minority diffusion length (L).

SUMMARY OF THE INVENTION

According to the present invention the surface of a sample of n-type silicon material is treated in preparation for determining the minority carrier diffusion length of the material by applying a strong oxidizing agent taken from the group consisting of potassium permanganate [$KMnO_4$], potassium dichromate [$K_2Cr_2O_7$], and ammonium dichromate [$(NH_4)_2Cr_2O_7$]. The oxidized surface after rinsing and drying assures a consistently large surface photovoltage that is stable during the measurements for minority carrier diffusion length.

BRIEF DESCRIPTION OF THE DRAWING

The sole FIGURE of the drawing is a plot of test data comparing the relative stability of two samples treated in accordance with the present invention to the same samples, respectively, prepared under the American Society for Testing Materials Standard method (F 391-78).

DETAILED DESCRIPTION OF THE PREFERRED EMBODIMENT OF THE INVENTION

The present invention is based on the discovery that the method prescribed by ASTM F 391-78 may be unreliable in that it does not provide consistently large and stable surface photovoltages. I have discovered that not only must the surface be appropriately treated by cleansing and etching but also that it must be treated with a strong oxidizing agent. The agent is selected to provide both a large and stable surface photovoltage.

It is known in the art that certain oxidizing agents used for surface treatments produce low surface recombination velocity of minority carriers, particularly carriers in p-type silicon. See A. R. Moore and H. Nelson, "Surface Treatment of Silicon for Low Surface Recombination Velocity", RCA Review 17, 3 (1956) which describes the use of sodium dichromate ($Na_2Cr_2O_7$) for surface treatment of p-type silicon to produce low surface recombination velocity. Moreover, T. M. Buck and F. S. McKim, in their article "Effects of Certain Chemical Treatments and Ambient Atmospheres on Surface Properties of Silicon", J. Electrochem. Soc. 105, 709 (1958), describe boiling a sample in water ($H_2O$) and subsequent surface treatment with sodium dichromate ($Na_2Cr_2O_7$) to provide a p-type surface on n-type silicon. The use of sodium dichromate in certain environments may be acceptable but in the processing of silicon materials in modern-day facilities, the presence of sodium as an ion or element resulting from the sodium dichromate is unacceptable because of its potential for contamination.

Based on this background I discovered that potassium dichromate ($K_2Cr_2O_7$) can be used as a surface preparation oxidizing agent in the following manner. The surface of a body of n-type silicon material such as a wafer sample must be substantially (1) free of contamination on the surface, (2) free of oxides of silicon on the surface, and (3) free of contamination or damage within the bulk regions adjacent to and including the surface of the wafer. The details for preparing the surface free of oxides, contamination and damage will be described in detail hereinafter. Assuming that the surface has been appropriately so prepared, it is then treated with a strong oxidizing agent comprising a 0.01 to 1.0 molar solution taken from the group consisting of potassium permanganate [$KMnO_4$], potassium dichromate [$K_2Cr_2O_7$], and ammonium dichromate [$(NH_4)_2Cr_2O_7$] in distilled water at ~70°-75° C. for three minutes. The preferred solution is 0.1 molar. Moreover while the preferred temperature range of the solution is 70° to 75° C. it can be lower or higher but not greater than 85° C. At temperatures greater than about 85° C. an undesirable stain film forms on the silicon surface. At room temperature a much lower surface photovoltage is generally obtained. The sample so treated is removed and rinsed of any residue in distilled water and allowed to dry in a clean ambient such as dry air, dry $N_2$, or dry $O_2$. Alternatively, the sample can be dried on a clean hot plate at about 150° C. for about 5 minutes. Tests performed on samples treated with each of the oxidizing agents provided a usefully large voltage, on the order of 8 millivolts (MV) or greater, that also remained stable during the typical measurement period of 2-5 minutes. In the experiments conducted to provide the data shown in the drawing, two wafers were used. Both were 5 cm in diameter, formed of n-type, float-zoned silicon having bulk resistivity of $35\pm10$ ohm-cm.

As seen in the drawing, plot 12 is derived from data points 14, 16, ... 18 that were taken in sequence at the time periods indicated along the abscissa on a (111) surface of a specimen body formed of n-type silicon material prepared and treated according to the invention. The surface photovoltage was kept constant with a photon flux ($I_o$) of about $8.9 \times 10^{12}$ photons/cm² second. The wavelength ($\lambda$) of the illuminating light was 0.826 $\mu$m.

The tests performed at only one single wavelength ($\lambda$) of illuminating light and photon flux ($I_o$) are done to determine the effect of the surface preparation treatments. Any single wavelength of light within the operable range may be used for the the tests. It should be understood, once it has been determined that a particular sample or speciman when properly treated according to the invention is stable, that sample and similar bodies can be measured for their minority carrier diffusion length (L) values using the procedure described hereinabove, such as described in my U.S. Pat. No. 4,333,051, for example.

The same specimen wafer, having been similarly prepared to free the surface of oxides, contamination and damage as indicated herein, was treated according to the ASTM method of boiling the specimen in distilled boiling water for one hour. Measurements of the surface photovoltage under the same operating conditions as described above provided data points 20, 22 . . . 24 defining plot 26. It is seen that plot 26 shows the continuous decrease in voltage from 2 to about 1 millivolt. Not only is that voltage inadequate to provide noise-free diffusion length measurements but also the voltage is unstable in that it decreases substantially in the period during which the measurements are made, typically 1 to 2 minutes. Either or both of these conditions are unsatisfactory for diffusion length measurements. Plot 12 made according to the present invention is clearly stable in not varying with time, at least through 5 minutes (300 seconds), and with a relatively large and adequate voltage of 44 millivolts.

A similar comparison test on a (100) surface of a specimen wafer of n-type silicon material was performed. The data points 30, 32 . . . 34 define a straight line plot 36 derived from tests on the body prepared according to this invention. Data points 40, 42, 44, 46 define a non-linear plot 48 from the same appropriately treated body subsequently prepared by the ASTM method. The voltage increases (for reasons not understood) from 0.16 to 0.2 millivolts during the 300 second measuring period. Clearly, plot 48 is indicative of an unsatisfactory voltage condition in that it is too small and unstable. Plot 36 made under conditions of the invention provides an adequate voltage of 26 millivolts that is stable.

As indicated above, the surface treatment that may be needed in the preparation of a surface photovoltage measurement on a sample prior to the oxidizing step depends upon the history of the sample. The following are steps that would, in general, provide for any of the conditions usually encountered in semiconductor processing to prepare the surface prior to the oxidizing step:

(1) The surface is cleaned to remove surface contaminants that may have accumulated on the surface during previous processing. A detailed description of such cleaning steps are given by W. Kern et al. in the article "Cleaning Solutions Based on Hydrogen Peroxide.", RCA Review, 31, 187 (1970).

(2) Following the surface contamination cleaning step, a layer of silicon dioxide that may exist on the wafer surface is removed by an HF-containing etch followed by a quench of the etch with distilled water, to avoid leaving a stain film, followed by a rinse in distilled water to remove said quenched etch.

(3) Following either the cleaning or silicon dioxide removal steps, the surface region is etched to remove damage material or contaminated material. The damaged surface may have been caused, for example, by sawing, lapping, or polishing the wafer. The material may have been contaminated, for example, by previous processing or handling. Such contamination would include a sub-oxide of silicon ($SiO_x$) not removable by the above-described silicon dioxide removal step. A preferred etch solution comprises a mixture of nitric acid ($HNO_3$) and hydrofluoric acid (HF). In addition, and optionally, acetic acid ($CH_3COOH$) can be used in the etch mixture to moderate the etch rate if desired. This etch is also quenched as described above.

The three oxidizing agents of the group consisting of potassium permanganate, potassium dichromate and ammonium dichromate, were the only useful agents discovered to practice this invention. Many other candidate oxidizing agents were tried without success.

What is claimed is:

1. A method of treating the surface of a sample of n-type silicon material in preparation for determining the minority carrier diffusion length of the material by the surface photovoltage method comprising the steps of:
   (a) applying to said surface an aqueous solution consisting essentially of a strong oxidizing agent selected from the group consisting of potassium permanganate [$KMnO_4$], potassium dichromate [$K_2Cr_2O_7$], and ammonium dichromate [$(NH_4)_2Cr_2O_7$],
   (b) rinsing said surface with distilled water to remove residue of said oxidizing agent from said surface; and
   (c) drying said rinsed surface in a clean ambient.

2. The method of claim 1 comprising the step prior to the application of said oxidizing agent of cleaning said surface with a cleaning solution to remove contaminants from said surface.

3. The method of claim 1 comprising the step prior to the application of said oxidizing agent of etching said surface with an HF-containing etch to remove silicon dioxide on said surface, thereafter quenching said etch with distilled water to avoid leaving a stain film on said surface, and then rinsing said surface in distilled water to remove said quenched etch.

4. The method of claim 1 comprising the step prior to the application of said oxidizing agent of etching said surface with an etching solution to remove surface layers of damaged or contaminated material of silicon, thereafter quenching said etch with distilled water to avoid leaving a stain film on said surface, and then rinsing said surface in distilled water to remove said quenched etch.

* * * * *